US006579769B2

United States Patent
Shimada et al.

(10) Patent No.: US 6,579,769 B2
(45) Date of Patent: *Jun. 17, 2003

(54) SEMICONDUCTOR DEVICE MANUFACTURING METHOD INCLUDING FORMING FOX WITH DUAL OXIDATION

(75) Inventors: Hiroyuki Shimada, Shizuoka (JP); Masaaki Higashitani, Kanagawa (JP); Hideo Kurihara, Kanagawa (JP); Hideki Komori, Kanagawa (JP); Satoshi Takahashi, Kanagawa (JP)

(73) Assignees: Fujitsu Ltd., Kawasaki (JP); Advanced Micro Devices, Inc., Sunnyvale, CA (US); Fujitsu AMD Semiconductor Ltd., Fukushima (JP)

( * ) Notice: Subject to any disclaimer, the term of this patent is extended or adjusted under 35 U.S.C. 154(b) by 125 days.

This patent is subject to a terminal disclaimer.

(21) Appl. No.: 09/726,384

(22) Filed: Dec. 1, 2000

(65) Prior Publication Data

US 2001/0000247 A1 Apr. 12, 2001

Related U.S. Application Data

(63) Continuation of application No. 09/193,252, filed on Nov. 17, 1998, now Pat. No. 6,187,640.

(30) Foreign Application Priority Data

Oct. 18, 1996 (JP) ............................................... 8-276480

(51) Int. Cl.$^7$ ........................ H01L 21/336; H01L 21/76

(52) U.S. Cl. ........................ 438/297; 438/439; 438/452

(58) Field of Search ................................. 438/297, 439, 438/452

(56) References Cited

U.S. PATENT DOCUMENTS

| 4,518,630 | A | | 5/1985 | Grasser |
| 4,551,910 | A | * | 11/1985 | Patterson |
| 5,010,028 | A | | 4/1991 | Gill et al. |
| 5,151,381 | A | | 9/1992 | Liu et al. |
| 5,565,371 | A | | 10/1996 | Gill |
| 5,580,816 | A | * | 12/1996 | Hemmenway et al. |
| 5,637,528 | A | | 6/1997 | Higashitani et al. |
| 5,739,063 | A | * | 4/1998 | Liu et al. |
| 5,815,433 | A | | 9/1998 | Takeuchi |

* cited by examiner

Primary Examiner—John F. Niebling
Assistant Examiner—Ron Pompey
(74) Attorney, Agent, or Firm—Armstrong, Westerman & Hattori, LLP

(57) ABSTRACT

In a method of manufacturing a semiconductor device, there are comprised the steps of forming an oxidation preventing layer on a surface of a semiconductor substrate, forming a first window in the oxidation preventing layer, placing the semiconductor substrate in a first atmosphere in which an oxygen gas and a first amount of a chlorine gas are supplied through and then heating the semiconductor substrate at a first temperature such that a first selective oxide film is to grown by thermally oxidizing the surface of the semiconductor substrate exposed from the first window, forming a second window by patterning the oxidation preventing layer, and placing the semiconductor substrate in a second atmosphere in which the oxygen gas and a second amount, which is larger than the first amount, of the chlorine gas are supplied through and then heating the semiconductor substrate at a second temperature such that a second selective oxide film is formed and that a thickness of the first selective oxide film formed below the first window is enhanced. Accordingly, generation of projection on bird's beak of a selective oxide film can be prevented in a semiconductor device manufacturing method including a step of growing a local oxidation of silicon film.

9 Claims, 7 Drawing Sheets

SEMICONDUCTOR DEVICE MANUFACTURING METHOD INCLUDING FORMING FOX WITH DUAL OXIDATION

This application is a continuation of prior application Ser. No. 09/193,252 filed Nov. 17, 1998, now U.S. Pat. No. 6,187,640.

BACKGROUND OF THE INVENTION

1. Field of the Invention

The present invention relates to a semiconductor device manufacturing method and, more particularly, a semiconductor device manufacturing method including a step of growing a local oxidation of silicon (LOCOS) layer on a surface of a semiconductor substrate by using a silicon nitride film as a mask.

2. Description of the Prior Art

A LOCOS layer which is formed on a surface of a semiconductor substrate is employed as a field isolation film for isolating respective devices. A thickness of the field oxide layer is formed differently according to respective portions of device isolation.

When the field oxide layers which have different thicknesses in a plurality regions on the surface of the semiconductor substrate are formed, the thickness of the field oxide layers can be controlled according to a method shown in FIGS. 1A to 1D, for example.

First, as shown in FIG. 1A, a silicon oxide film acting as a pad 2 is formed by thermally oxidizing a surface of a silicon substrate 1. In turn, a silicon nitride layer 3 is formed on the pad 2 by CVD. This silicon nitride layer 3 is formed to prevent oxidation of the surface of the silicon substrate 1. Then, a first window 3a is formed over a first region A, in which a first field oxide layer is to be formed, by patterning the silicon nitride layer 3 by means of photolithography.

Then, as shown in FIG. 1B, a first field oxide layer (LOCOS layer) 4 is formed by oxidizing the surface of the silicon substrate 1 below the first window 3a. This oxidation is the first oxidation step of forming a field oxide layer. For example, this oxidation is performed by heating the surface of the silicon substrate 1 up to 1000° C. and supplying oxygen to the surface of the silicon substrate 1 via the first window 3a of the silicon nitride layer 3. In addition, upon supply of the oxygen, chlorine is added at about 0.25 flow rate percents in the course of oxidation. Then, supply of oxygen and chlorine is suspended, then the temperature of the silicon substrate 1 is increased up to 1125° C. Then, after the temperature of the silicon substrate 1 has been stable, the silicon substrate 1 is oxidized in an oxygen atmosphere to which chlorine is added at 0.05 flow rate percents, whereby a thickness, of the first field oxide layer 4 is increased.

During such oxidation, a surface of the silicon oxynitride layer 3 is oxidized slightly to thus form a silicon oxynitride film 5.

Then, as shown in FIG. 1C, second windows 3b are formed over second regions B, in which second field oxide layers are to be formed respectively, by patterning the silicon nitride layer 3 by means of second photolithography.

Then, as shown in FIG. 1D, second field oxide layers (LOCOS layer) 6 are grown by oxidizing the surface of the silicon substrate 1 below the second windows 3b and simultaneously the thickness of the first field oxide layer 4 below the first window 3a is increased. This oxidation is a second oxidation step which is performed under the same conditions as the first oxidation step.

As described above, according to patternings of the silicon nitride layer 3 and oxidations of the silicon substrate 1 both carried out twice, two types of filed oxide layers 4, 5 having different thickness can be formed in different regions A, B on the surface of the silicon substrate 1.

However, according to above mentioned steps, as shown in FIG. 2, sometimes a projection 6a is generated on a part of top ends of bird's beak of the second field oxide layer 6.

For this reason, when a thin silicon oxide film 7 is formed by thermally oxidizing the surface of the silicon substrate 1 again after the silicon nitride layer 3 and the pad 2 have been removed on the substrate 1, a thickness of such thin silicon oxide film 7 is made locally small on the projection 6a formed on the surface of the bird's beak.

Therefore, if the silicon oxide film 7 is employed as a tunnel insulating film, carriers are apt to leak from such locally thinned area of the silicon oxide film 7 on the projection 6a.

Such generation of the projection on the bird's beak of the LOCOS, as mentioned above, has been found by the inventors of the present invention. It may be supposed that such generation is due to stress in the silicon oxynitride layer 5 which is formed on the surface of the silicon nitride layer 3. More particularly, when the window 3b is formed in the silicon nitride layer 3 on which the silicon oxynitride layer 5 has been formed, stress is applied to the silicon nitride layer 3 because of stress of the silicon oxynitride layer 5, and then a crack 3c shown in FIG. 3 is easy to be generated on a side surface of the silicon nitride layer 3 exposed from the window 3b. Therefore, if the surface of the silicon substrate is oxidized via the window 3b later, silicon oxynitride is also generated in the silicon nitride layer 3 along the crack 3c, so that such silicon oxynitride generated in the silicon nitride layer 3 is combined integrally with the bird's beak of the LOCOS layer 6. As a result, after the silicon nitride layer 3 has been removed, such silicon oxynitride still remains as the projection 6a in vicinity of the top ends of the bird's beak.

SUMMARY OF THE INVENTION

It is an object of the present invention to provide a method of manufacturing a semiconductor device which is able to prevent generation of projection on bird's beak of a LOCOS.

According to the present invention, in the steps of forming windows at least two times and forming field oxide layers two times, e.g., forming a first window on an oxidation preventing film on a semiconductor substrate; then forming a first field oxide layer by oxidizing a surface of the semiconductor substrate via the first window, then forming second windows on the oxidation preventing film, then forming a second LOCOS layer via the second windows and also increasing a thickness of the first field oxide layer, etc., a chroride acid gas or chlorine gas is contained in a first oxidation gas and a second oxidation gas respectively. At that time, the content of the chlorine gas used in oxidation is contained larger in the second oxidation gas than the first oxidation gas.

When the chlorine is increased in the oxidizing step, an ability of oxidizing the surface of the semiconductor substrate can be enhanced but an ability of oxidizing the oxidation preventing layer can be reduced. Therefore, a growth rate of the field oxide layer via the second window can be enhanced whereas an area along a crack generated in the oxidation preventing layer is difficult to be oxidized. As a result, different oxide is hard to be formed on a surface of bird's beak of the LOCOS layer, so that generation of the projection formed of such different type of oxide can be prevented.

When the chlorine or chloride gas is set to more than 0.5 flow rate percents relative to a total gas flow rate when an oxygen gas and the chloride gas are supplied to an oxidation atmosphere, an effect of preventing the oxidation of the LOCOS becomes remarkable. In this case, such effect appears more remarkably if the substrate temperature is set to less than 1000° C. during oxidation.

DESCRIPTION OF THE PREFERRED EMBODIMENTS

A semiconductor device manufacturing method according to an embodiment of the present invention will be explained in detail with reference to the accompanying drawings hereinafter.

FIGS. 4A to 4D are sectional views showing steps of forming a LOCOS layer according to an embodiment of the present invention. LOCOS is used as a field oxide layer.

Figure 4A:
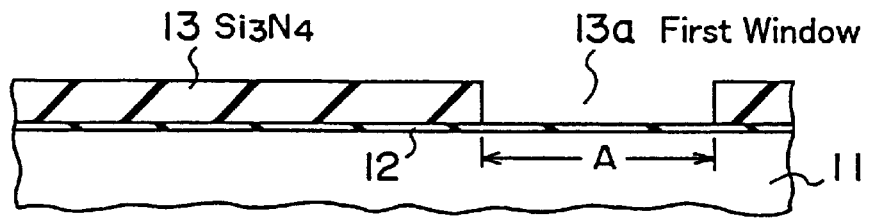
FIGS. 4A to 4D are sectional views showing steps of forming a field oxide layer according to an embodiment of the present invention.

First, as shown in FIG. 4A, a pad oxide layer 12 made of $SiO_2$ is formed by thermally oxidizing a surface of a silicon substrate (i.e. semiconductor substrate) 11 to have a thickness of 25 nm. Then, a silicon nitride layer 13 is formed on the pad oxide layer 12 by CVD to have is a thickness of 170 nm. The silicon nitride layer 13 can function as a film for preventing oxidation of the silicon substrate 11. Then, a first window 13a is formed over a first region A, in which a first LOCOS layer is to be formed, by patterning a silicon nitride layer (i.e. oxidation preventing layer) 13 by virtue of photolithography.

Figure 4B:
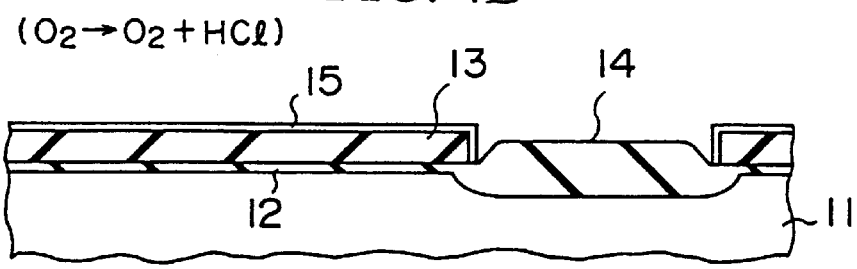
Figure 5:
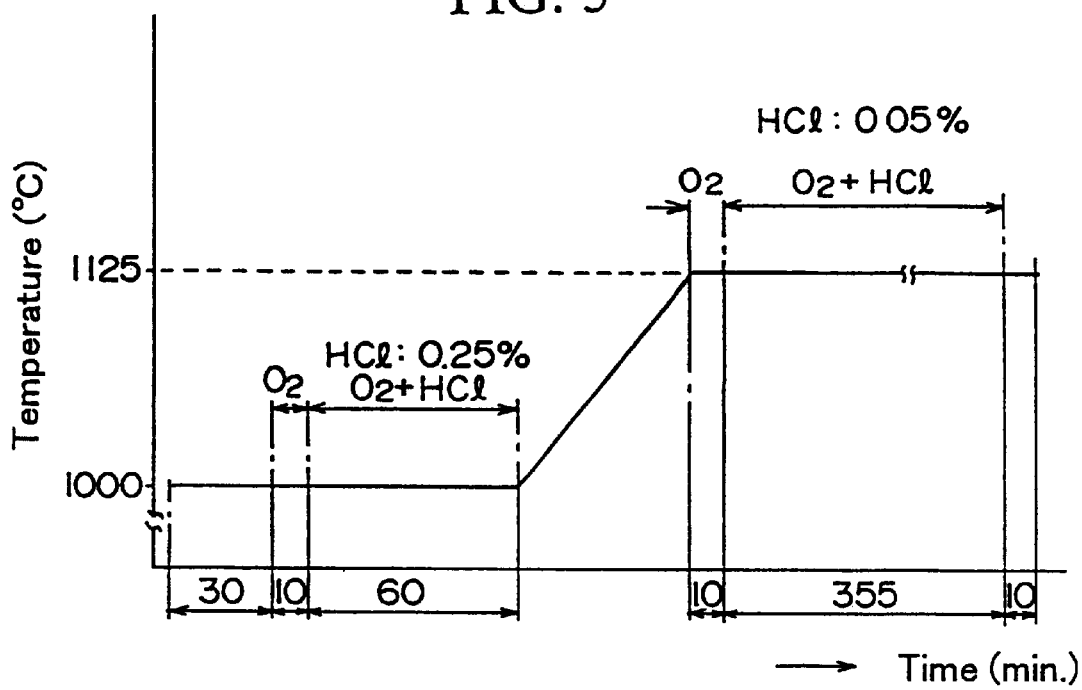
FIG. 5 is a chart showing the first oxidation condition for the LOCOS layer according to the embodiment of the present invention an a time base.

Then, as shown in FIG. 4B, a first selective oxide layer (i.e. LOCOS layer) 14 is formed by thermally oxidizing the surface of the silicon substrate 11 below the first window 13a. Such thermal oxidation is the first oxidation step of forming the first selective oxide layer 14. As shown in FIG. 5, while changing the temperature and composition of an atmosphere gas around the silicon substrate 11, such thermal oxidation is carried out. Conditions of such thermal oxidation will be explained hereunder.

To begin with, the silicon substrate 11 is heated up to 1000° C. under the situation that the silicon substrate 11 is placed in a normal pressure atmosphere containing a nitrogen gas. Such condition is kept for thirty minutes from the time when the temperature of the silicon substrate 11 comes up to 1000° C. so as to stabilize the temperature of the silicon substrate 11.

Then, an oxygen ($O_2$) gas is supplied to an atmosphere around the silicon substrate 11 at a flow rate of 14 liter/min for ten minutes, whereby the surface of the silicon substrate 11 exposed from the first window 13a can be thermally oxidized to grow the first selective oxide layer 14 thin.

In turn, while keeping the substrate temperature at 1000° C., the oxygen gas and a hydrochloric acid (HCl) gas are supplied to the atmosphere around the silicon substrate 11 at flow rates of 13.965 liter/min and 0.035 liter/min respectively, and then the thickness of the first selective oxide layer 14 is increased by keeping the above condition for one hour. In this case, a supply amount of the hydrochloric acid gas is 0.25 flow rate percents. This hydrochloric acid gas is supplied slightly to promote oxidation. Where a supply amount of the gas signifies a rate of a flow rate of each gas to a total flow rate of the gas which is introduced into the atmosphere around the silicon substrate, which can be similarly applied to explanation given in the following.

Then, after the atmospheric gas around the silicon substrate 11 has been replaced with a nitrogen gas, the temperature of the silicon substrate 11 is increased up to 1125° C. Then, this condition is maintained for ten minutes to stabilize the substrate temperature.

Then, while keeping the substrate temperature at 1125° C., the oxygen gas and the hydrochloric acid gas are supplied to the atmosphere around the silicon substrate 11 at flow rates of 13.986 liter/min and 0.014 liter/min respectively. Then, the thickness of the first selective oxide layer 14 is enhanced by keeping this condition for 355 minutes. In this case, a supply amount of the hydrochloric acid gas is 0.05 flow rate percents.

Accordingly, the first oxidation step is terminated and at the same time the first growth step of the first selective oxide layer 14 is terminated, whereby a thickness of the first selective oxide layer 14 becomes 290 nm. Since the exposed surface of the silicon nitride layer 13 is also oxidized in the first oxidation step, a thin silicon oxynitride (SiON) layer 15 having a thickness of about 15 nm can be grown on the surface of the silicon nitride layer 13.

Figure 4C:
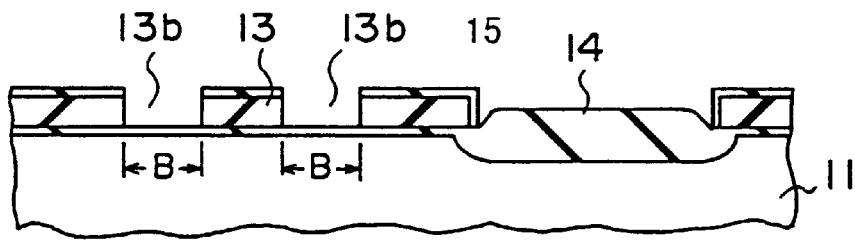

Then, as shown in FIG. 4C, second windows 13b are formed over second regions B, in which second selective oxide layers are to be formed respectively, by patterning the silicon nitride layer 13 by means of second photolithography.

Figure 4D:
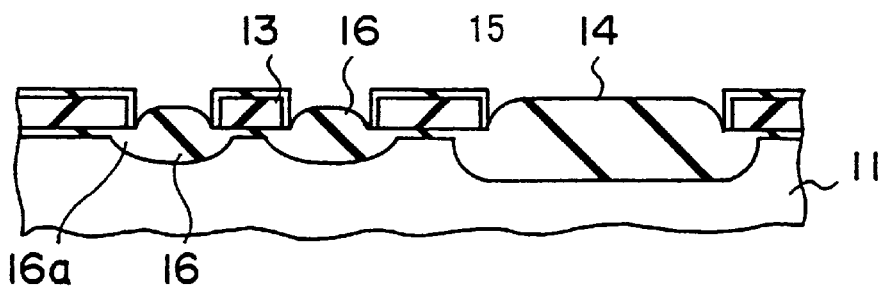

Then, as shown in FIG. 4D, a second selective oxide layer (i.e. LOCOS layer) 16 of 250 nm thickness is grown by oxidizing the surface of the silicon substrate 11 exposed from the second window 13b and simultaneously a thickness of the first selective oxide layer 14 below the first window 13b is increased up to about 540 nm. This oxidation is the second oxidation step which is performed under the condition shown in FIG. 6. Next, such second oxidation process will be explained hereunder.

At first, the silicon substrate 11 is heated up to 1000° C. under the situation that the silicon substrate 11 is placed in the normal pressure atmosphere containing a nitrogen gas. Then, such condition is kept as it is for thirty minutes from the time when the temperature of the silicon substrate 11 has reached 1000° C. to thereby stabilize the temperature of the silicon substrate 11.

Then, the oxygen ($O_2$) gas is supplied to the atmosphere around the silicon substrate 11 at a flow rate of 14 liter/min for ten minutes. As a result, the surface of the silicon substrate 11 is thermally oxidized via the first and second windows 13a, 13b to grow the second selective oxide layer 16 thin and also to increase the thickness of the first selective oxide layer 14.

Subsequently, while holding the substrate temperature at 1000° C., the oxygen gas and the hydrochloric acid gas are supplied to the atmosphere around the silicon substrate 11 at flow rates of 13.895 liter/min and 0.105 liter/min respectively. Then, the thickness of the first selective oxide layer 14 and the thickness of the second elective oxide layer 16 are enhanced by keeping this condition for one hour. In this case, a supply amount of the hydrochloric acid gas is 0.75 flow rate percents.

Next, after the atmospheric gas around the silicon substrate 11 has been replaced with the nitrogen gas, the temperature of the silicon substrate 11 is also increased up to 1125° C. Then, such condition is maintained for ten minutes to stabilize the substrate temperature.

After this, while keeping the substrate temperature at 1125° C., the thickness of the first selective oxide layer 14 and the thickness of the second selective oxide layer 16 are enhanced in the same manner as the latter half of the first oxidation step. Thus, the second oxidation step has been terminated.

As described above, according to two patterning steps of the silicon nitride 3 and two oxidation steps of the silicon substrate 11, two types of the first selective oxide layer 14 and the second selective oxide layer 16 having the different thickness respectively can be formed in different regions A, B on the surface of the silicon substrate 11.

Figure 7:
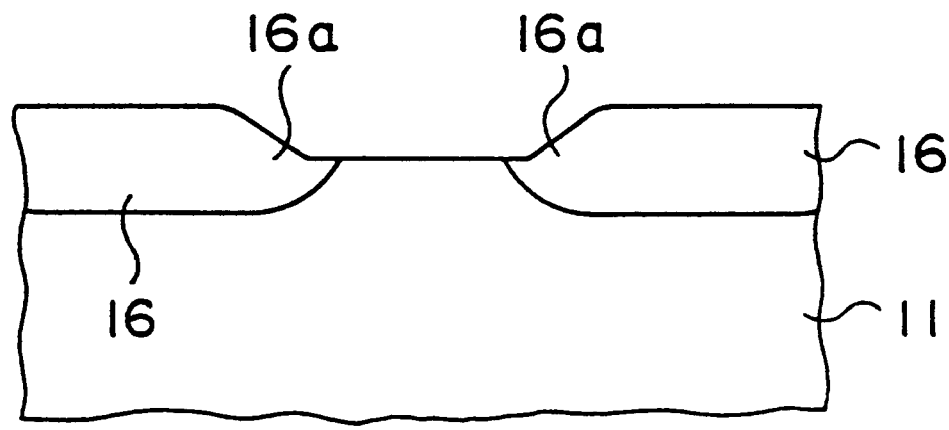
FIG. 7 is an enlarged sectional view showing bird's beak of the LOCOS layer formed by an oxidation method according to the embodiment of the present invention.

Next, after the silicon nitride layer 13 has been removed by phosphoric acid, a surface of the bird's beak of the second selective oxide layer 16 is checked by the inventors of the present invention. As a result, a condition of the surface of the bird's beak has been detected as shown in FIG. 7, wherein there exists no projection.

Figure 8:
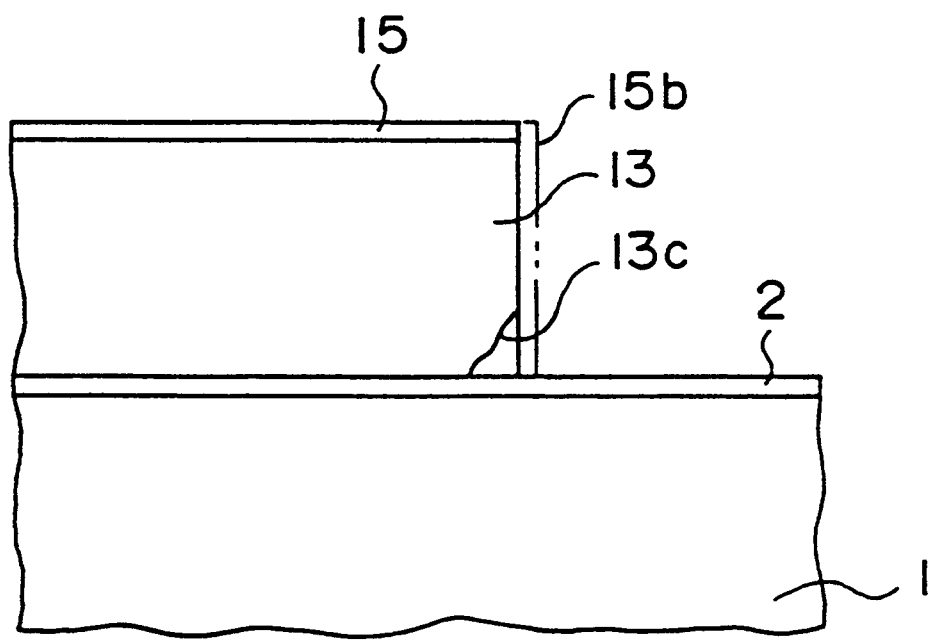
FIG. 8 is an enlarged sectional view showing an oxidation preventing layer immediately before the second oxidation is carried out in the oxidation method according to the embodiment of the present invention.

This reason for the above will be given in the following. More particularly, in forming the second window 13b on the silicon nitride layer 13 shown in FIG. 4C, there may be such a chance that a crack 13c reaching the pad oxide film 2, as shown in FIG. 8, is caused due to stress of the silicon oxynitride layer 15 formed on the silicon nitride layer 13.

Figure 6:
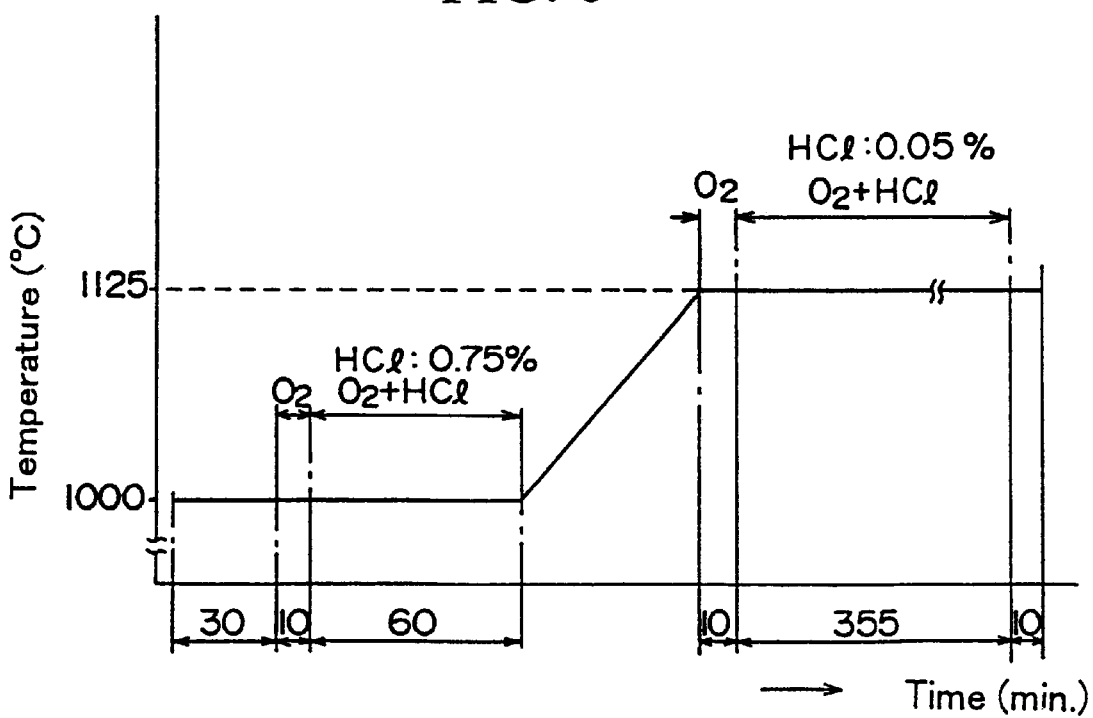
FIG. 6 is a chart showing the second oxidation condition for the LOCOS layer according to the embodiment of the present invention an a time base.

Then, as shown in FIG. 6, if a content of the hydrochloric acid is increased like 0.75 flow rate percents in the second thermal oxidation, an oxidation rate of the silicon nitride layer 13 which is exposed from the side surface of the second window 13b is decreased according to the increase of the hydrochloric acid rather than the first oxidation step. On the contrary, an oxidation rate of the surface of the silicon substrate 11 which is exposed from the second window 13b is increased according to the increase of the hydrochloric acid rather than the first oxidation step. Hence, an inside of the silicon nitride layer 13 along the crack 13c becomes hard to be oxidized, so that the silicon oxynitride is difficult to grow on the bird's beak 16a.

Figure 1A:
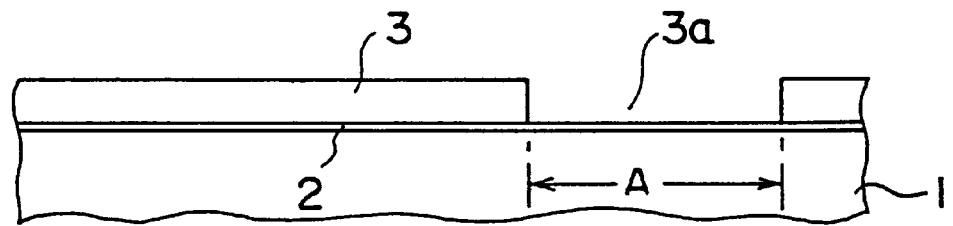
FIGS. 1A to 1D are sectional views showing steps of forming a LOCOS layer in the prior art.
Figure 1B:
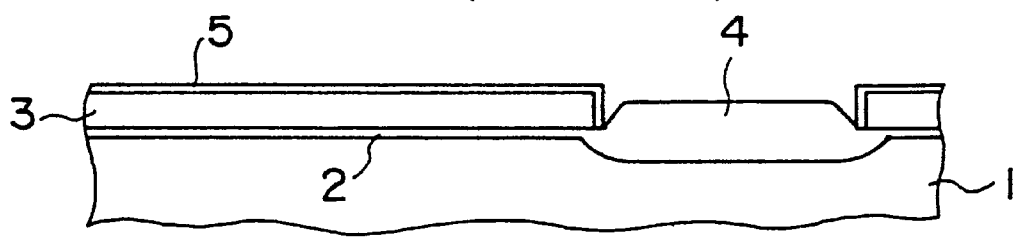
Figure 1C:
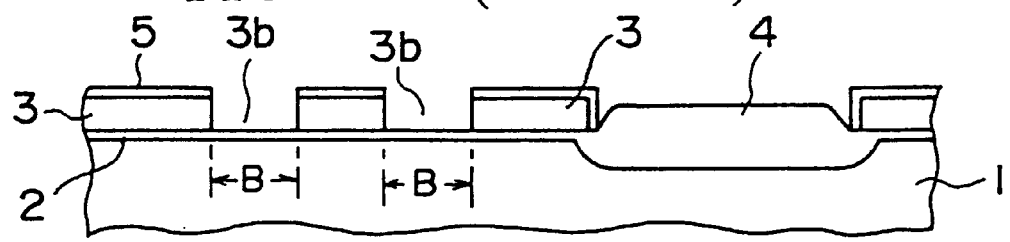
Figure 1D:
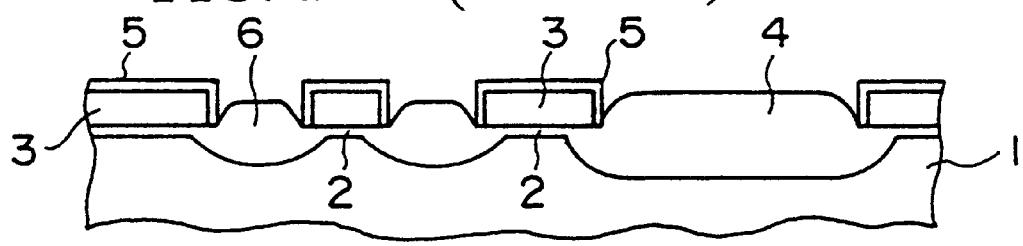
Figure 2:
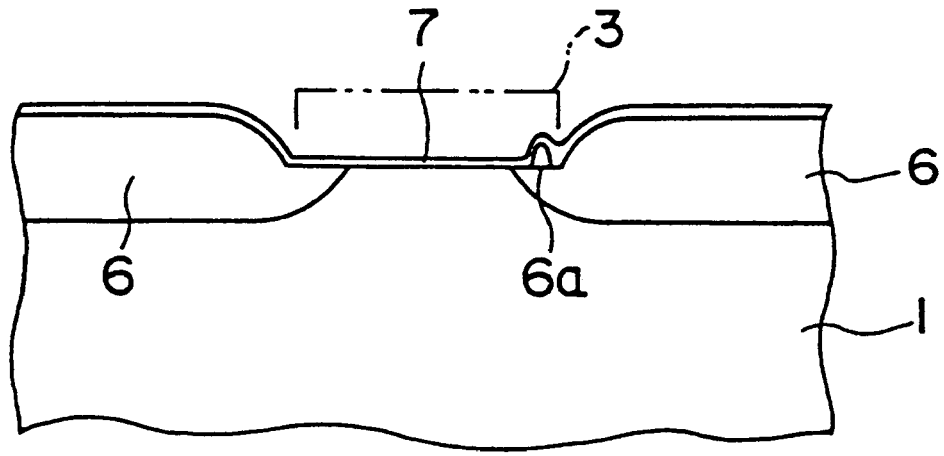
FIG. 2 is an enlarged sectional view showing bird's beak of the LOCOS layer formed by an oxidation method in the prior art.

In contrast to the above, in the prior art, in both the oxidation step performed before the second window 13b is formed and the oxidation step performed after the second window 13b has been formed, a content of the hydrochloric acid gas is set to 0.25 flow rate percents in compliance with the condition shown in FIG. 6. In other words, after the second window 13b has been opened, the surface of the silicon nitride layer 13 is hard to be oxidized if a supply amount of the hydrochloric acid gas is made small, so that oxygen is ready to percolate from the crack 13b generated in the silicon nitride layer 13. As a result, as shown in FIG. 2, the silicon oxynitride is grown on the surface of the bird's beak to thus cause the projection 6a.

According to the experiment of the inventors of the present invention, in the oxidation step carried out after the second window 13b has been formed, no projection has been generated at all on the surface of the bird's beak 16a if the hydrochloric acid gas is set to more than 0.5 flow rate percents. Therefore, in order to prevent generation of the projection on the bird's beak 16a, the hydrochloric acid gas to be contained in the oxygen atmosphere must be set to more than 0.5 flow rate percents in the oxidation step carried out after the second window 13b has been opened. However, since an etching effect for the oxide film due to the hydrochloric acid is enhanced if an amount of the hydrochloric acid is supplied too much, the growth rates of the selective oxide layers 14, 16 become small respectively. Therefore, it is preferable that a supply amount of the hydrochloric acid gas should be set to more than 0.5 flow rate percents but less than 5 flow rate percents.

It is preferable that the temperature employed in oxidation should be set to 1000° C. or less in the former half of the oxidation step wherein a concentration of the hydrochloric acid is high and set to 1125° C. or more in the latter half wherein the concentration of the hydrochloric acid is reduced.

Next, a step of forming semiconductor memory cells performed after the selective oxide layers (referred to as "field oxide layers" hereinafter) 14, 16 have been grown will be explained in brief with reference to FIGS. 9A to 9D and FIGS. 10A to 10D hereinbelow. FIGS. 9A to 9D show a sectional shape of the semiconductor memory cells in the direction along which a word line extends respectively. FIGS. 10A to 10D are sectional views which are viewed from a I—I line in FIG. 9C and show sectional shapes in a condition that bit lines are provided to extend.

Figure 9A:
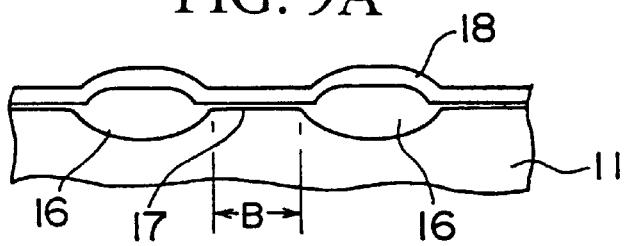
FIGS. 9A to 9D are sectional view showing steps of forming a semiconductor device in a region which is surrounded by the LOCOS layer formed according to the embodiment of the present invention.

First, steps to achieve the situation shown in FIG. 9A will be explained hereunder.

After the growth of the above first and second field oxide layers 14, 16 have been finished, the pad oxide film 12 on the silicon substrate 11 is removed by hydrogen fluoride and then the silicon nitride layer 13 is removed by phosphoric acid.

Then, by thermally oxidizing a region which is surrounded by the field oxide layers 14, 16 at 1050° C., a tunnel oxide film 17 made of $SiO_2$ is formed to have a thickness of 10 nm. Then, a first amorphous silicon layer 18 into which phosphorus (impurity) is doped is grown by CVD on the tunnel oxide film 17, the first field oxide layer 14, and the second field oxide layer 16 to have a thickness of 50 nm.

Figure 9B:
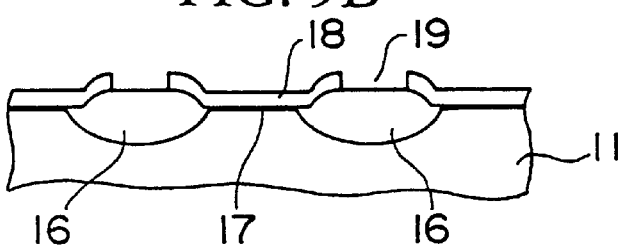

Then, as shown in FIG. 9B, by patterning the first amorphous silicon layer 18, recesses 19 are formed on the first field oxide layer 14 and the second field oxide layer 16 in the direction along which the bit lines extend, as described later.

Figure 9C:
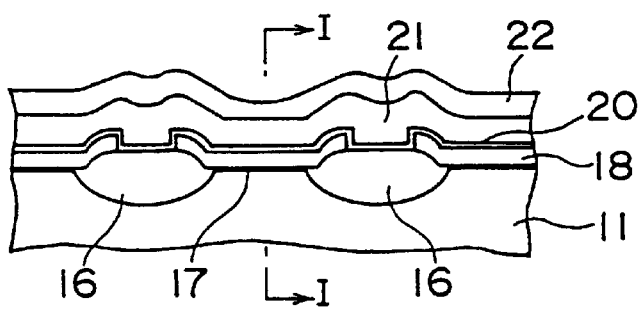
Figure 10A:
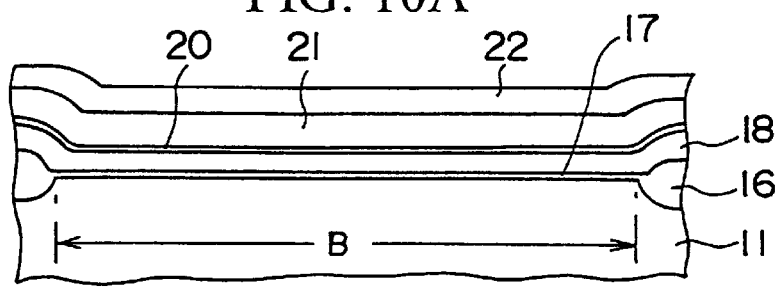
FIGS. 10A to 10D are sectional views showing steps of forming the semiconductor device, viewed from a sectional shape taken along a I—I line in FIG. 9C.

Then, steps to achieve the situations shown in FIGS. 9C and 10A will be explained hereunder.

An $SiO_2$ film of 6.5 nm thickness is formed by thermally oxidizing the surface of the first amorphous silicon layer 18, then the silicon nitride layer of 10 nm thickness is formed on the SiO$_2$ film, and then an SiO$_2$ film is formed by thermally oxidizing the surface of the silicon nitride layer. As a result, the oxide film, the nitride film, and the oxide film are stacked in sequence on the first amorphous silicon layer 18. This three-layered structure film is called an ONO (oxide/nitride/oxide) layer 20 hereinafter.

Then, a second amorphous silicon layer 21 into which phosphorus (impurity) is doped is formed by CVD on the ONO film 20 to have a thickness of 120 nm. Then, a tungsten silicide layer 22 is grown by CVD on the second amorphous silicon layer 21 to have a thickness of 150 nm.

Figure 10B:
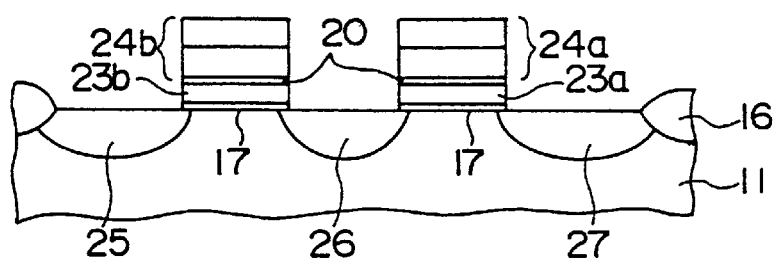

Then, as shown in FIG. 10B, respective layers from the tungsten silicide layer 22 to the first amorphous silicon layer 18 are patterned by using a sheet of mask. According to this patterning, word lines 24a, 24b consisting of the second amorphous silicon layer 21 and the tungsten silicide layer 22 and floating gates 23a, 23b consisting of the first amorphous silicon layer 18 can be formed.

Two word lines 24a, 24b are provided on the silicon substrate 11 to pass through the region B surrounded by the second field oxide layer 16. The floating gates 23a, 23b are formed under the word lines 24a, 24b in the region B via the ONO layer 20 respectively. The floating gates 23a, 23b provided in one region B are isolated from the floating gates 23a, 23b provided in adjacent region B. The word lines 24a, 24b can function as control gates of the transistors in the region B.

After this, impurity is introduced into the region B surrounded by the second field oxide layer 16 by using the word lines 24a, 24b as a mask and then diffused. Thus, three impurity diffusion regions 25 to 27 are formed on both sides of a pair of word lines in the region B. Accordingly, two EEPROMs can be formed in the region B.

Figure 10C:
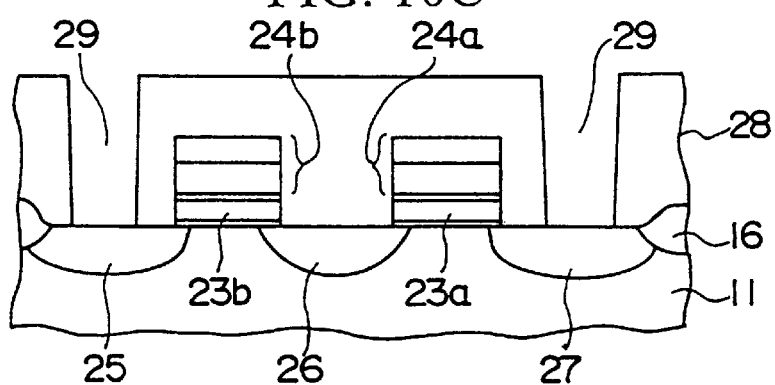

Then, as shown in FIG. 10C, a protective insulating film 28 made of SiO$_2$, PSG, or the like is formed on the word lines 24a, 24b and the field oxide layers 14, 16. Then, opening portions 29 are formed in two impurity diffusion regions 25, 27, which are located near both end sides of the region B, respectively by patterning the protective insulating film 28.

Figure 9D:
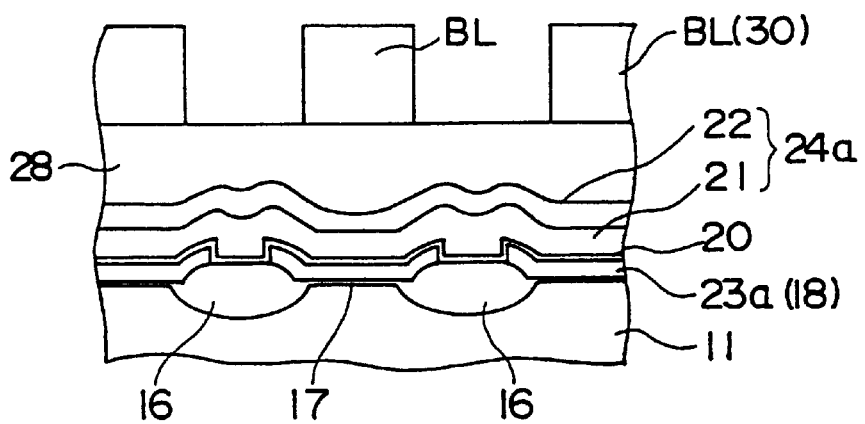
Figure 10D:
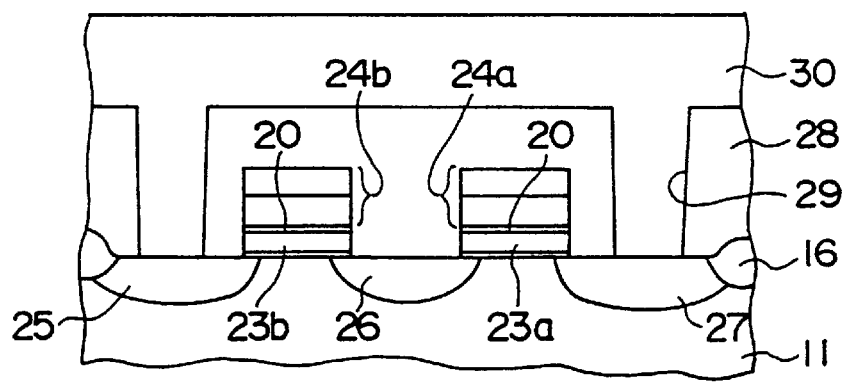

Then, as shown in FIG. 10D, a metal film 30 made of tungsten, etc. is formed in the opening portions 29 and on the protective insulating film 28. Then, as shown in FIG. 9D and FIG. 10D, a bit line BL is formed by patterning the metal film 30. The bit line BL is provided to extend along the direction intersecting substantially orthogonally with the word lines 24a, 24b and is connected to the impurity diffusion layers 25, 27.

In the semiconductor memory cell formed by the above steps, the carriers, i.e., electrons or holes are tunneled through the tunnel oxide film 17 by the electric field generated by the control gates 24a, 24b so that the carriers are stored in the floating gates 23a, 23b. In this event, since there exists no projection on the bird's beak 16a of the second field oxide layer 16, writing error is difficult to occur.

Figure 3:
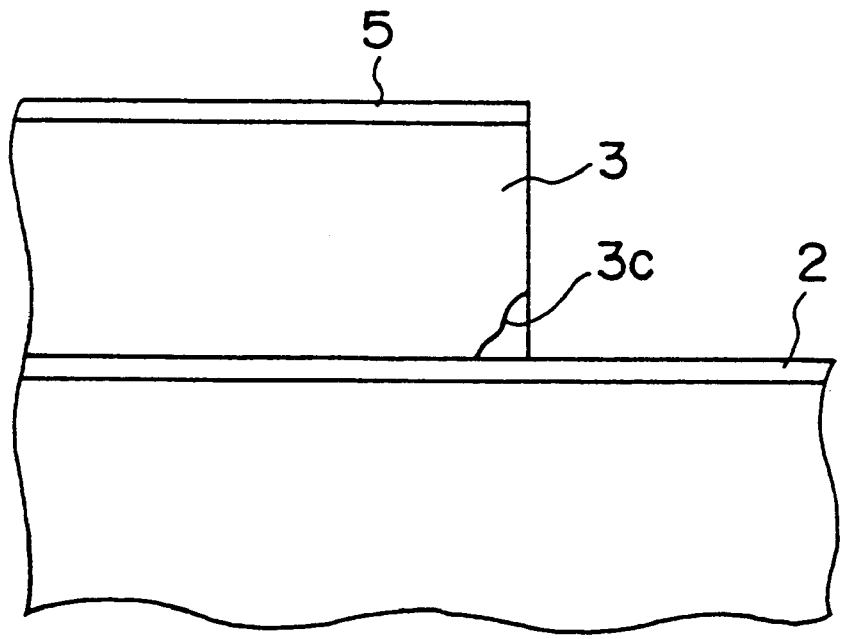
FIG. 3 is an enlarged sectional view showing an oxidation preventing layer immediately before the second oxidation is carried out in the oxidation method in the prior art.

Although, as shown in FIGS. 2 and 3, oxidation has been made at the same temperature in the second oxidation step in the above embodiment, the above effect of preventing the projection can be achieved even if the different temperatures are employed. In this case, it is important to set the second hydrochloric acid concentration to more than 0.5 flow rate percents. It is preferable that, in order to suppress generation of the silicon oxynitride and promote oxidation of the surface of the silicon substrate by increasing the hydrochloric acid concentration, the temperature should be set to less than 1000° C.

In the above embodiment, although the hydrochloric acid gas has been introduced into the oxidation atmosphere upon oxidation, a chlorine system gas such as a chlorine gas and others may be employed.

As described above, according to the present invention, a content of the chlorine gas is increased when the surface of the semiconductor substrate is oxidized via the window of the oxidation preventing film under the situation that the crack is generated in the oxidation preventing film on the semiconductor substrate. Hence, generation of the oxide film formed on the surface of the oxidation preventing film can be suppressed while an oxidation rate of the surface of the semiconductor substrate exposed from the window can be accelerated. As a result, oxidation in the LOCOS formed on the surface of the semiconductor substrate below the window can be prevented and also generation of the projection made of different type of oxide films on the surface of the bird's beak of the LOCOS can be prevented.

Such effect of suppressing the oxidation of the oxidation preventing film becomes remarkable if the chlorine gas flowing through the oxidation atmosphere is set to more than 0.5 flow rate percents. Such effect appears more remarkably if the substrate temperature is set to less than 1000° C. in oxidation.

What is claimed is:

1. A method of manufacturing a semiconductor device comprising the steps of:

forming an oxidation preventing layer on a surface of a semiconductor substrate;

forming a first window by patterning the oxidation preventing layer;

placing the semiconductor substrate in a first atmosphere in which an oxygen gas and a first amount of a chlorine or chloride gas are supplied, and then heating the semiconductor substrate at a first temperature such that a first field oxide layer is to grown by thermally oxidizing the surface of the semiconductor substrate exposed from the first window;

forming a second window by patterning the oxidation preventing layer; and placing the semiconductor substrate in a second atmosphere in which the oxygen gas and a second amount, which is larger than the first amount, of the chlorine or chloride gas are supplied, and then heating the semiconductor substrate at a second temperature such that a second field oxide layer is formed and that a thickness of the first field oxide layer formed below the first window is enhanced.

2. The method as set forth claim 1, wherein the step of forming the oxidation preventing layer on the surface of the semiconductor substrate is the step of forming a nitride semiconductor layer on the surface of the semiconductor substrate.

3. The method as set forth claim 1, the semiconductor substrate is a silicon substrate and the oxidation preventing layer is a silicon nitride layer.

4. The method as set forth claim 1, wherein the second amount of the chlorine gas is set to more than 0.5 flow rate percent.

5. The method as set forth claim 1, wherein the first temperature and the second temperature are set to less than 1000° C.

6. The method as set forth claim 1, further comprising, before the step of forming the second window, the step of placing the semiconductor substrate in a third atmosphere in which the oxygen gas and a third amount, which is smaller than the first amount, of the chlorine gas are supplied, and then heating the semiconductor substrate at a third temperature, which is higher than the first temperature, so as to enhance the thickness as set forth the first selective oxide film.

7. The method as set forth claim 6, wherein the third temperature temperature is set to more than 1125° C.

8. The method as set forth claim 1, further comprising, after the surface of the semiconductor substrate positioned below the first window and the second window has been thermally oxidized in the second atmosphere, the step of placing the semiconductor substrate in a fourth atmosphere in which the oxygen gas and a fourth amount, which is smaller than the second amount, of the chlorine gas are supplied, and then heating the semiconductor substrate at a fourth temperature, which is higher than the second temperature, so as to enhance the thickness of the first selective oxide film and the second selective oxide film.

9. The method as set forth claim 8, wherein the third temperature and the fourth temperature are set to more than 1125° C.

* * * * *